US012279538B2

(12) United States Patent
Zhong et al.

(10) Patent No.: US 12,279,538 B2
(45) Date of Patent: Apr. 15, 2025

(54) PHASE CHANGE MEMORY UNIT AND PREPARATION METHOD THEREFOR

(71) Applicants: Shanghai Integrated Circuit Equipment & Materials Industry Innovation Center Co., Ltd., Shanghai (CN); SHANGHAI IC R&D CENTER CO., LTD., Shanghai (CN)

(72) Inventors: Min Zhong, Shanghai (CN); Ming Li, Shanghai (CN); Shoumian Chen, Shanghai (CN); Gaoming Feng, Shanghai (CN)

(73) Assignees: Shanghai Integrated Circuit Equipment & Materials Industry Innovation Center Co., Ltd, Shanghai (CN); SHANGHAI IC R&D CENTER CO., LTD., Shanghai (CN)

( * ) Notice: Subject to any disclaimer, the term of this patent is extended or adjusted under 35 U.S.C. 154(b) by 543 days.

(21) Appl. No.: 17/786,526

(22) PCT Filed: Jul. 23, 2020

(86) PCT No.: PCT/CN2020/103754
§ 371 (c)(1),
(2) Date: Jun. 16, 2022

(87) PCT Pub. No.: WO2021/120620
PCT Pub. Date: Jun. 24, 2021

(65) Prior Publication Data
US 2023/0363299 A1 Nov. 9, 2023

(30) Foreign Application Priority Data

Dec. 19, 2019 (CN) .......................... 201911315353.X
Dec. 19, 2019 (CN) .......................... 201911315361.4

(51) Int. Cl.
*H10N 70/00* (2023.01)
*H10B 63/00* (2023.01)
(Continued)

(52) U.S. Cl.
CPC ......... *H10N 70/8413* (2023.02); *H10B 63/10* (2023.02); *H10B 63/20* (2023.02);
(Continued)

(58) Field of Classification Search
CPC ............. H10N 70/8413; H10N 70/023; H10N 70/066; H10N 70/231; H10N 70/8265;
(Continued)

(56) References Cited

U.S. PATENT DOCUMENTS 9,178,141 B2 * 11/2015 Liu .................... H10N 70/8828
2006/0011902 A1 * 1/2006 Song ................... H10N 70/231
257/4
2007/0018149 A1 1/2007 Sato

FOREIGN PATENT DOCUMENTS

CN 101640251 A1 2/2010

* cited by examiner

*Primary Examiner* — Mohammed R Alam
(74) *Attorney, Agent, or Firm* — Bayramoglu Law Offices LLC

(57) ABSTRACT

The present invention disclosures a phase change memory unit, wherein comprising from bottom to top: a bottom electrode, a heating electrode, a phase change unit and a top electrode, the phase change unit is a longitudinally arranged column, which comprises: a cylindrical selector layer, a circular barrier layer and a circular phase change material layer form inside to outside; wherein, the bottom electrode, the heating electrode and the circular phase change material layer are sequentially connected, and the selector layer is connected to the top electrode. The present invention using trench sidewall deposition or via filling, forming the cylindrical phase change unit which is a circular nested structure, (Continued)

which can improve reliability of a device, greatly reduce volume of a phase change operation area and heat energy required, thus heating efficiency is improved obviously, the power consumption of the device is reduced, and high-density storage is realized.

20 Claims, 14 Drawing Sheets

(51) Int. Cl.
   *H10B 63/10* (2023.01)
   *H10N 70/20* (2023.01)
(52) U.S. Cl.
   CPC ......... *H10N 70/023* (2023.02); *H10N 70/066* (2023.02); *H10N 70/231* (2023.02); *H10N 70/8265* (2023.02)
(58) Field of Classification Search
   CPC .. H10N 70/826; H10N 70/8828; H10B 63/10; H10B 63/20; H10B 63/24
   See application file for complete search history.

=Prior Art=

=Prior Art=

=Prior Art=

=Prior Art=

PHASE CHANGE MEMORY UNIT AND PREPARATION METHOD THEREFOR

CROSS-REFERENCE TO RELATED APPLICATION

This application claims priority of International Patent Application Serial No. PCT/CN2020/103754, filed Jul. 23, 2020, which is related to and claims priority of Chinese Patent Application Serial No. CN 201911315361.4 and CN201911315353.X, filed Dec. 19, 2019. The entirety of each of the above-mentioned patent applications is hereby incorporated herein by reference and made a part of this specification.

TECHNICAL FIELD

The disclosure relates to the technical field of semiconductor integrated circuit manufacturing technology, in particular to a phase change memory unit structure and a preparation method therefor.

BACKGROUND

With emergence of a series of new information technologies such as big data, The Internet of Things, cloud computing, and artificial intelligence, etc. High read and write speed, low power consumption, high storage density, long service life, and high reliability are required for memory. At present, a new storage technology represented by phase-change memory are gradually replacing traditional DRAM and Flash, and has a broad application prospect in fields of artificial intelligence and integrated storage and computing chips.

An existing phase change memory unit (take Intel 3D X-point technology as an example) comprises a bottom electrode 01, a selector layer 02, a barrier layer 03, a phase change material layer 04 and a top electrode 05 from bottom to top, such as shown in FIG. 1. The phase change unit consists of a selector and a phase change resistor (1S1R).

In an actual manufacturing process of the above-mentioned phase-change memory unit, since after selector layer 02, the circular barrier layer 03 and the circular phase change material layer 04, the three-layer films are deposited, the three layers are etched by performing lithography and etching once to form a pattern. Therefore, the etching will cause following two problems:

First, due to a difference in the materials of the three films of the device layer 02, the circular barrier layer 03 and the circular phase change material layer 04, etching rates thereof are different, so the sidewall of the pattern after etching are not in an ideal vertical profile, but there are twists and turns, as shown in FIG. 2. It can result in a decrease in device reliability.

Second, during the etching, plasma will damage the sidewall of the etched pattern, which increase the line edge roughness (LER) of the sidewall of the selector layer 02, the circular barrier layer 03 and the circular phase change material layer 04, as shown in FIG. 3. It will affect performances of a phase change device.

Meanwhile, the above-mentioned phase change memory unit as shown in FIG. 1 can adopt a vertical stacking (3D) technology of two-layer phase change units to form high-density storage, as shown in FIG. 21. However, since the circular phase change material layer 04 in a first layer of a phase change unit is very sensitive to temperature, when preparing the second layer of the phase change unit, thermal budget of a process therefor is very limited (less than 350° C.), it makes very high demands on selecting the materials of the selector layer 02 and the circular phase change material layer 04 and the process therefor, which will affect the performances and yield of the device.

Therefore, a new type of phase change memory unit structure is needed to solve side effects of the process of the phase change memory device.

SUMMARY

The purpose of the present invention is to overcome the above-mentioned defects in the prior art, and provide a phase change memory unit and a preparation method therefor.

In order to achieve the above objective, the present invention adopts a phase change memory unit, comprising from bottom to top: a bottom electrode, a heating electrode, a phase change unit and a top electrode, the phase change unit is a longitudinally arranged column, which comprises a cylindrical selector layer, a circular barrier layer and a circular phase change material layer from inside to outside; wherein, the bottom electrode, the heating electrode and the circular phase change material layer are sequentially connected, and the selector layer is connected to the top electrode.

Further, the number of the bottom electrode is one.

Further, the heating electrode is a circular or via structure longitudinally set on the bottom electrode, and is correspondingly connected to the circular lower end of the circular phase change material layer.

Further, the heater electrode is an L-shaped structure set on the bottom electrode, and the horizontal bottom sides of the L-shaped structure are connected to the surface of the bottom electrode, the upper end of the vertical sidewall of the L-shaped structure is correspondingly connected to the circular lower end of the circular phase change material layer.

Further, the bottom electrode is connected to a substrate, a dielectric layer is set on the substrate, and the phase change memory unit is embedded in the dielectric layer.

Further, the top electrode comprises a metal layer and a contact hole connected to the metal layer, and the contact hole is connected to the selector layer.

Further, multiple bottom electrodes and multiple heating electrodes are in one-to-one correspondence.

Further, the bottom electrodes are a via.

Further, the heating electrodes are a sector structure, a cubic structure or a via longitudinally set on the bottom electrode, and are correspondingly connected to the circular lower end of the circular phase change material layer; or, the heating electrodes are an L-shaped structure set on the bottom electrodes, and the horizontal bottom sides of the L-shaped structure are connected to the surface of the bottom electrodes, the upper end of the vertical sidewall of the L-shaped structure is correspondingly connected to the circular lower end of the circular phase change material layer.

Further, the bottom electrodes are connected to a substrate, the substrate is set with one to multiple dielectric layers, and the phase change memory unit is embedded in the dielectric layer.

Further, the substrate comprises multiple metal interconnection layers, and at least one of the bottom electrodes is connected to one of the multiple metal interconnection layers different from other bottom electrodes.

In order to achieve the above objective, the present invention adopts a preparation method for a phase change memory unit, wherein comprising: S01: providing a substrate, depositing a first dielectric layer on the substrate, and forming a bottom electrode in the substrate and the first dielectric layer; wherein the number of the bottom electrode is one; S02: depositing a second dielectric layer on the first dielectric layer, and forming a first trench or a via in and through the second dielectric layer corresponding to the position of the bottom electrode; S03: forming a heating electrode on the inner wall surface of the first trench or in the via, and connecting the heating electrode with the bottom electrode; S04: depositing a third dielectric layer on the second dielectric layer, and forming a second trench in and through the third dielectric layer corresponding to the position of the bottom electrode; S05: sequentially forming a circular phase change material layer and a circular barrier layer on the sidewall surface of the second trench, and connecting the circular phase change material layer with the heating electrode; S06: depositing a material of a selector layer in the second trench in the circular barrier layer to fill the second trench; S07: removing excess materials of the selector layer, the circular barrier layer and the circular phase change material layer outside the second trench, and forming a cylindrical phase change unit in the second trench; S08: depositing a fourth dielectric layer on the third dielectric layer, and forming a top electrode connected to the selector layer in the fourth dielectric layer.

Further, in S03, the heating electrode which is a circular or L-shaped structure is formed on the inner wall surface of the first trench; or, filling the material of the heating electrode in the via to form the heating electrode which is a solid structure.

Further, in S05, using a high-density plasma chemical vapor deposition method to sequentially form the circular phase change material layer and the circular barrier layer on the sidewall surface of the second trench.

Further, a preparation method for the heating electrode which is the circular structure comprises: depositing the material of the heating electrode on the inner wall surface of the first trench, removing the material of the heating electrode positioned on the bottom surface of the first trench, depositing the material of the second dielectric layer in the first trench to fill the first trench and then flattening.

Further, a preparation method for the heating electrode which is the L-shaped structure comprises: depositing the material of the heating electrode on the inner wall surface of the first trench, patterning the material of the heating electrode, removing excess material of the heating electrode positioned on the sidewall and bottom surface of the first trench, depositing the material of the second dielectric layer in the first trench to fill the first trench and then flattening.

In order to achieve the above objective, the present invention adopts a preparation method for a phase change memory unit, wherein comprising: S11: providing a substrate, depositing a first dielectric layer on the substrate, and forming multiple bottom electrodes in the substrate and the first dielectric layer; S12: depositing a second dielectric layer on the first dielectric layer, and forming a first trench or a via in and through the second dielectric layer corresponding to the positions of the bottom electrodes; wherein, the number of the first trench is one, multiple vias and the bottom electrodes are in one-to-one correspondence; S13: forming heating electrodes on the inner wall surface of the first trench or in the vias, and connecting the heating electrodes with the bottom electrodes in one-to-one correspondence; S14: depositing a third dielectric layer on the second dielectric layer, and forming a second trench in and through the third dielectric layer corresponding to the positions of the bottom electrodes; wherein, the number of the second trench is one; S15: sequentially forming a circular phase change material layer and a barrier layer on the sidewall surface of the second trench, and connecting the circular phase change material layer with the heating electrodes; S16: depositing a material of a selector layer in the second trench in the circular barrier layer to fill the second trench; S17: removing excess materials of the selector layer, the circular barrier layer and the circular phase change material layer outside the second trench, and forming a cylindrical phase change unit in the second trench; S18: depositing a fourth dielectric layer on the third dielectric layer, and forming a top electrode connected to the selector layer in the fourth dielectric layer.

Further, in S13, depositing the material of the heating electrodes on the inner wall surface of the first trench, and then patterning to form the heating electrodes which are sector structures, cubic structures or L-shaped structures; wherein, the horizontal bottom sides of the L-shaped structure are connected to the surfaces of the bottom electrodes, and the upper end of the vertical sidewall of the L-shaped structure is correspondingly connected to the circular lower end of the circular phase change material layer; or, by filling the material of the heating electrodes in the via to form the heating electrodes which is a solid structure.

Further, in S15, using a high-density plasma chemical vapor deposition method to sequentially form the circular phase change material layer and the circular barrier layer on the sidewall surface of the second trench.

Further, a preparation method for the heating electrodes which are the sector structure or cubic structure comprises: depositing the material of the heating electrode on the inner wall surface of the first trench, removing the material of the heating electrodes positioned on the bottom surface of the first trench, depositing the material of the second dielectric layer in the first trench to fill the first trench and then flattening.

Further, a preparation method for the heating electrodes which are the L-shaped structure comprises: depositing the material of the heating electrodes on the inner wall surface of the first trench, patterning the material of the heating electrodes and removing excess material of the heating electrodes positioned on the sidewall surface and bottom surface of the first trench, depositing the material of the second dielectric layer in the first trench to fill the first trench and then flattening.

The advantage of the present invention is that, on the one hand, the present invention prepares a cylindrical phase change unit which is a circular nested structure by trench sidewall deposition or via filling, the critical operation area of the circular phase change material layer where is a contact area between the circular phase change material layer and the heating electrode is not damaged, thus reliability of a device can be improved. Meanwhile, since the phase of the material of the circular phase change material layer is crystalline after deposition, and the thickness of the circular phase change material layer formed by the sidewall deposition is very thin, a phase change area is only the contact area between the circular phase change material layer and the heating electrode, during the operations of the phase change device, that is, only part of the phase change material that is in contact with the heating electrode will undergo phase change, so volume of a phase change operation area and heat energy required therefor can be greatly reduced, so as to reduce the power consumption of the device. In addition, the thickness of the heating electrode formed by the trench sidewall deposition is thinner, current density generated is higher, and heating efficiency is significantly improved, so as to further reduce the power consumption of the device.

On the other hand, the present invention combines a cylindrical phase change unit with multiple heating electrodes to form a structure in which multiple phase change resistors share one selector (a 1SnR structure, S represents for selector, R represents for phase change resistance, n represents the number); wherein, the top ends of multiple heating electrodes are connected to the outermost phase change material layer of the same cylindrical phase change unit, and the bottom ends of multiple heating electrodes are connected to different bottom electrodes in a one-to-one correspondence; and the bottom electrodes can be connected to different metal interconnect layers. Compared with a traditional 1S1R structure, the 1SnR structure of the present invention eliminates n−1 selectors, and different phase change resistances can be connected to the bottom electrodes of different metal interconnection layers through corresponding respective heating electrodes, then a chip area in horizontal direction will not be increased, so as to realize high-density storage.

DETAILED DESCRIPTION

The present invention provides a phase change memory unit, comprising from bottom to top: a bottom electrode, a heating electrode, a phase change unit and a top electrode, the phase change unit is a longitudinally arranged column, which comprises: a cylindrical selector layer, a circular barrier layer and a circular phase change material layer form inside to outside; wherein, the bottom electrode, the heating electrode and the circular phase change material layer are sequentially connected, and the selector layer is connected to the top electrode.

The present invention using trench sidewall deposition or via filling, forming the cylindrical phase change unit which is a circular nested structure, which can improve reliability of a device, greatly reduce volume of a phase change operation area and heat energy required, thus heating efficiency is improved obviously, the power consumption of the device is reduced, and high-density storage is realized.

The content of the present invention will be further described in detail below in conjunction with the accompanying drawings of the specification. It should be understood that the present invention can have various changes in different examples, which do not depart from the scope of the present invention, and the descriptions and diagrams therein are essentially for illustrative purposes, rather than limiting the present invention. It should be noted that the drawings all adopt a very simplified form and all use imprecise ratios, which are only used to conveniently and clearly assist in explaining the purpose of the embodiments of the present invention.

Figure 1:
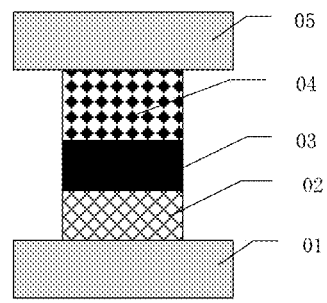
FIG. 1 is a schematic diagram of a conventional phase change memory unit structure.
Figure 2:
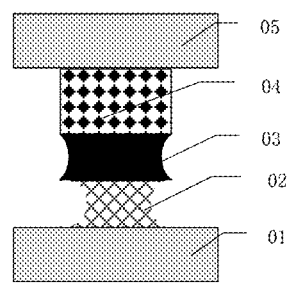
FIG. 2-3 are schematic diagrams of defects generated in a preparation method for an existing phase change memory unit.
Figure 3:
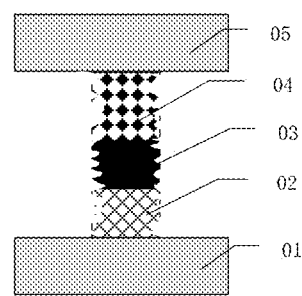
Figure 4:
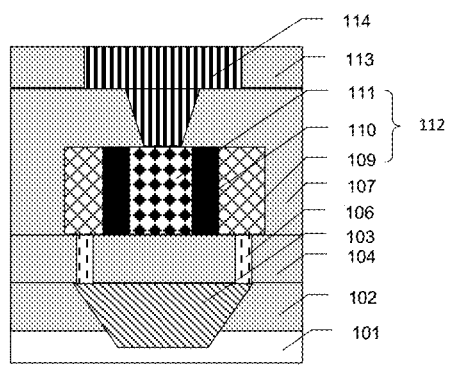
FIG. 4 is a schematic diagram of a phase change memory unit structure according to a preferred embodiment 1 of the present invention.

In following specific embodiments of the present invention, please refer to FIG. 4, which is a schematic diagram of a phase change memory unit structure according to a preferred embodiment 1 of the present invention. As shown in FIG. 4, the phase change memory unit of the present invention can be set on a substrate 101. The substrate 101 can be set with one to multiple dielectric layers, for example, the first to the fourth dielectric layers 102, 104, 107, and 113; the phase change memory unit can be embedded in the dielectric layer.

The substrate 101 can comprise a semiconductor material, such as a silicon substrate, a gallium arsenide substrate, a germanium substrate, a silicon germanium substrate, or a fully depleted silicon-on-insulator (FDSOI) substrate. The substrate 101 can also be an integrated circuit, comprising an integrated circuit having a gate tube such as a triode, a diode, etc.

The bottom electrode 103 can be set in the substrate 101 and the first dielectric layer 102 simultaneously. For example, the lower part of the bottom electrode 103 is set in the substrate 101, and upper part thereof is exposed on the surface of the substrate 101 and is set in the first dielectric layer 102. The bottom electrode 103 can be a cylindrical structure, such as a truncated cone shape as shown in FIG. 4. The bottom electrode 103 can be a tungsten electrode, but is not limited thereto.

A phase change unit 112 comprises from inside to outside: a cylindrical selector layer 111, a circular barrier layer 110 and a circular phase change material layer 109.

A heating electrode 106 adopts a ring structure set on the upper surface of the bottom electrode 103, for example, an elliptical ring, a circular ring, a rectangular ring, a polygonal ring, or a fan ring. In the embodiment, the heating electrode 106 adopts the circular ring. Wherein, the outer diameter of the heating electrode 106 should preferably not be larger than the circumferential diameter of the upper surface of the bottom electrode 103, that is, the heating electrode 106 should be set within the upper surface area of the bottom electrode 103. The circular upper end of the heating electrode 106 is correspondingly connected to the lower end surface of the circular phase change material layer 109.

The top electrode 114 can comprise an upper metal layer and a lower contact hole which are connected, and the contact hole is connected to the selector layer 111.

Wherein, the lower end of the heating electrode 106 is only connected to the bottom electrode 103, the upper end of the heating electrode 106 is only connected to the circular phase change material layer 109 positioned at the outermost part of the cylindrical phase change unit 112, and the top electrode 114 is only connected to the selector layer 111 positioned at the innermost part of the cylindrical phase change unit 112.

The material of the selector layer 111 can be a PN diode or a bidirectional threshold switch (OTS) of at least one of chalcogenide alloy materials in chalcogenide system. Meanwhile, the material of the selector layer 111 should not be phase changed during the operations of the phase change memory device.

the circular barrier layer 110 is made of a conductive material and has stable chemical properties. It will not chemically react with the materials of the selector layer 111 and the circular phase change material layer 109 or cause element diffusion, which can prevent material interaction and element diffusion between the materials of the selector layer 111 and the circular phase change material layer 109. The material of the circular barrier layer 110 can be graphene, a carbon-containing compound, a two-dimensional material, and a material comprising at least one of Ti, W, Ta, Cu, WCN, WN and TaN.

The initial phase of the circular phase change material layer 109 is crystalline. The material of the circular phase change material layer 109 can be at least one of a GeTe—$Sb_2Te_3$ system, a GeTe—SnTe system, a $Sb_2Te$ system, a $In_3SbTe_2$ system, a Sb doping system and a system doped Sc, Ag, In, Al, In, C, S, Se, N, Cu and W elements.

A method for preparing the phase change memory unit shown in FIG. 4 according to the present invention will be further described through specific embodiments and accompanying drawings thereof.

Figure 5:
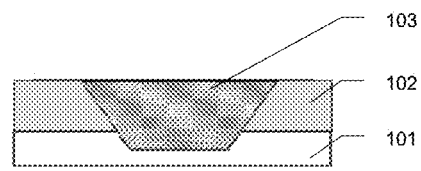
FIG. 5-11 are schematic diagrams of process steps for preparing a phase change memory unit structure of FIG. 4.

Please refer to FIG. 5-11, FIG. 5-11 are schematic diagrams of process steps for preparing a phase change memory unit structure of FIG. 4. As shown in FIG. 5-11, the preparation method for the phase change memory unit comprises following steps:

S01: as shown in FIG. 5, depositing the first dielectric layer 102 on the substrate 101, and forming bottom electrode 103 which is a big top and small bottom truncated cone-shaped structure in the substrate 101 and the first dielectric layer 102.

Wherein, the lower half part of the bottom electrode 103 can be positioned in the substrate 101, and upper half part thereof can be positioned in the first dielectric layer 102.

Figure 6:
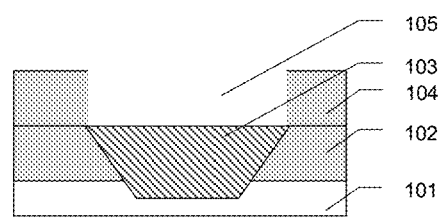

S02: as shown in FIG. 6, depositing the second dielectric layer 104 on the first dielectric layer 102, and forming a through first trench structure 105 through the second dielectric layer 104 in the second dielectric layer 104 corresponding to the position of the bottom electrode 103.

From a plan view, the shape of the first trench 105 can be one of circle, ellipse, rectangle and polygon. In the embodiment, the circular first trench 105 is formed in the second dielectric layer 104. Wherein, the diameter of the first trench 105 is slightly smaller than the diameter of the bottom electrode 103.

Figure 7:
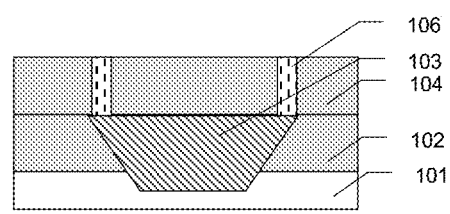

S03: as shown in FIG. 7, forming the heating electrode 106 on the inner wall surface of the first trench 105, and connecting the heating electrode 106 to the bottom electrode 103.

The shape of the formed heating electrode 106 can be at least one of elliptical ring, circular ring, rectangular ring, polygonal ring and fan ring. In the embodiment, depositing the material of the heating electrode on the inner wall surface of the circular first trench 105, filling the material of the second dielectric layer 104 in the first trench 105 fully, and then flattening by polishing to form the circular heating electrode 106.

The material of the heating electrode 106 can be TaN.

The thickness of the heating electrode 106 which is a difference between the radius of the outer ring and the radius of the inner ring thereof can be about 10 nm.

Figure 8:
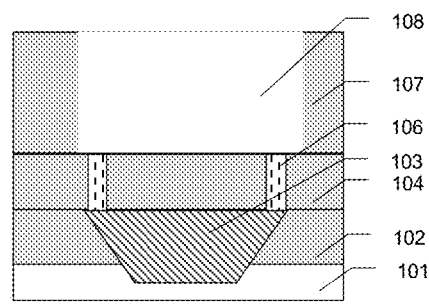

S04: as shown in FIG. 8, depositing the third dielectric layer 107 on the second dielectric layer 104, and forming a second trench 108 through the third dielectric layer 107 in the third dielectric layer 107 corresponding to the position of the bottom electrode 103.

The shape of the second trench 108 can be one of an elliptical cylindrical shape, a cylindrical shape, a rectangular parallelepiped, and a prism. In the embodiment, the second trench 108 is a cylindrical trench having a larger diameter than the first trench 105.

Figure 9:
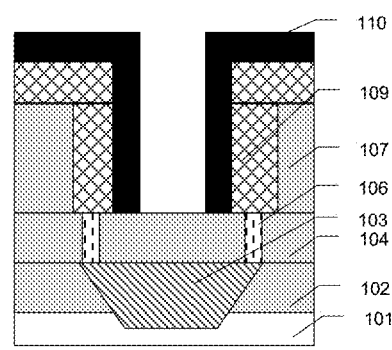

S05: as shown in FIG. 9, sequentially forming the three-dimensional circular phase change material layer 109 which is and the three-dimensional circular phase change material layer barrier layer 110 on the sidewall surface of the second trench 108, and connecting the circular phase change material layer 109 to the heating electrode 106.

The shapes of the three-dimensional circular phase change material layer 109 and the three-dimensional circular phase change material layer barrier layer 110 formed can be one of elliptical ring, circular ring, rectangular ring and polygonal ring.

the circular phase change material layer 109 can be deposited by high-density plasma chemical vapor deposition (HDP CVD), that is, the three-dimensional circular films are deposited only on the sidewall of the second trench 108, and deposition temperature thereof is 200-500° C. The phase of the circular phase change material layer is crystalline after deposition.

the circular barrier layer 110 can be deposited by HDP CVD, and can be deposited in the same equipment as the circular phase change material layer 109.

The top end of the heating electrode 106 is only connected to the circular phase change material layer 109 positioned at the outermost part of the cylindrical phase change unit 112.

In the embodiment, the material of the circular phase change material layer 109 is, for example, C-doped GeSbTe, and thickness thereof is, for example, 20 nm. The material of the circular barrier layer 110 is, for example, graphene, and thickness thereof is, for example, 5 nm. HDP CVD is used for depositing the materials of the circular phase change material layer and the circular barrier layer 110 in the same equipment to form the circular phase change material layer 109 and the circular barrier layer 110.

HDP CVD is a deposition-etch-deposition-etch method, so it can ensure that the circular barrier layer 110 and the circular phase change material layer 109 are only deposited on the sidewall of the second trench 108, and no film is deposited on the bottom of the second trench 108, thus the circular phase change material layer 109 and the circular barrier layer 110 are made into a three-dimensional circular shape.

Wherein, the deposition temperature of the material of the circular phase change material layer is 300° C., and phase of a C-doped GeSbTe film is crystalline after deposition. As a barrier layer, graphene has stable chemical properties and excellent electrical and thermal conductivity, which is beneficial to improve the performances of the phase change memory device. The inner diameter of the circular heating electrode 106 is larger than the inner diameter of the circular phase change material layer 109. Thus, a contact area between the two is the circular surface area of the circular heating electrode 106.

Figure 10:
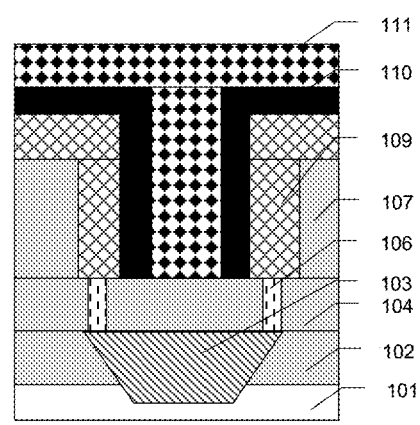

S06: as shown in FIG. 10, depositing the material of the selector layer 111 in the second trench 108 in the circular barrier layer 110, and filling the second trench 108 fully.

The material of the selector layer 111 can be a PN diode or a bidirectional threshold switch (OTS) of at least one of chalcogenide alloy materials in chalcogenide system, the material of the selector layer 111 should not be phase changed during the operations of the phase change memory device.

The selector layer 111 can be deposited by a chemical vapor deposition process or an atomic layer deposition process. The deposition process needs to ensure that there are no gaps and holes in the three-dimensional cylindrical selector layer 111.

In this embodiment, the material of the selector layer 111 is deposited by the chemical vapor deposition process. The material of the device layer 111 is selector to be GeSeAs2. Phase of a GeSeAs2 thin film is amorphous, as a gate device, the phase state of the $GeSeAs_2$ thin film will not be changed during the operations of the phase change unit 112.

Figure 11:
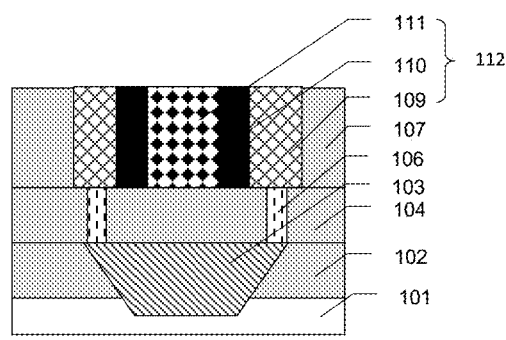

S07: as shown in FIG. 11, chemical mechanical polishing can be used for removing excess the materials of the selector layer 111, the circular barrier layer 110, and the circular phase change material layer 109 outside the second trench 108, thus forming the cylindrical phase change unit 112 in the second trench 108.

The cylindrical phase change unit 112 formed comprises from inside to outside: the selector layer 111, the circular barrier layer 110, and the circular phase change material layer 109. In this embodiment, the phase change unit 112 is cylindrical, and the $GeSeAs_2$ selector layer 111, a graphene barrier layer 110, and a C-doped $Ge_2Sb_2Te_5$ phase change material layer 109 are sequentially formed from inside to outside.

S08: depositing the fourth dielectric layer 113 on the third dielectric layer 107, and forming the top electrode 114 connected to the selector layer 111 in the fourth dielectric layer 113 to form the phase change memory unit structure with the circular heating electrode 106 and the cylindrical phase change unit 112.

The top electrode 114 formed is only connected to the selector layer 111 positioned at the innermost part of the cylindrical phase change unit 112. In this embodiment, the top electrode 114 is a trench with a double damascene structure, and the material of the top electrode 114 is copper. The contact hole in the double damascene structure is only connected to the $GeSeAs_2$ selector layer 111 in the cylindrical phase change unit 112.

Figure 12:
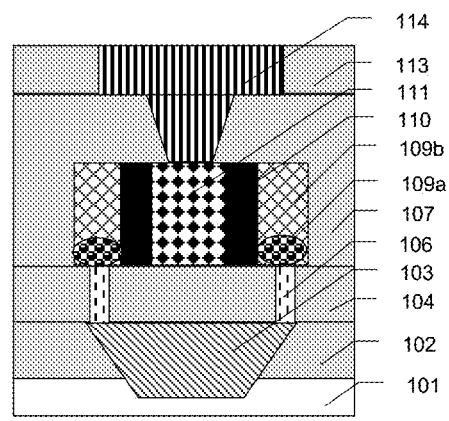
FIG. 12 is a schematic diagram of a phase change operation area of a phase change material layer.

In the above method, a circular trench filling process and a chemical mechanical polishing process are used to prepare the cylindrical phase change unit 112 which is a three-dimensional torus nested structure. The phase change unit 112 comprises a selector and a phase change resistor. Since during operations of a phase change device, a phase change area is only part of the phase change material above the heating electrode 106 (refer to FIG. 12), the phase of the material of the circular phase change material layer in this embodiment is crystalline after deposition, and the film thickness of the circular phase change material layer is only 20 nm, thus the volume of the phase change operation area and the heat energy required are greatly reduced, thereby reducing the power consumption of the device. As shown in FIG. 12, the initial phase of the circular phase change material layer 109 is crystalline. After a write operation, a phase change operation region 109a in the circular phase change material layer 109 changes from crystalline to amorphous, and phase of most of other regions 109b in the circular phase change material layer 109 are still crystalline.

Further, the thickness of the heating electrode 106 deposited by three-dimensional circular sidewall deposition is thinner, the current density generated by the heating electrode 106 is higher, thus the heating efficiency is improved, and power consumption thereof is further reduced.

In addition, the phase change unit 112 is formed by filling and polishing, the critical operation area of the circular phase change material layer where is a contact area between the circular phase change material layer and the heating electrode 106 is not damaged, thus the reliability of the device can be improved. the circular barrier layer 110 adopts graphene which have stable chemical properties and very low resistivity, it will not significantly increase the overall power consumption of the device.

In general, in this embodiment, the cylindrical phase change unit 112 which is a circular nested structure is prepared by the trench filling process and the chemical mechanical polishing process, compared with a traditional phase change unit structure that is vertically stacked, it avoids adverse effects on the performances and reliability of the device which are caused by defects generated during a preparation process.

It is worth noting that in this embodiment, all of the dielectric layers (the first to the fourth dielectric layers 102, 104, 107, and 113) are superimposed together in an area outside the phase change storage unit, and the materials of the dielectric layers can be the same or different, a specific material thereof can be a material of a dielectric layer in the prior art.

Figure 13:
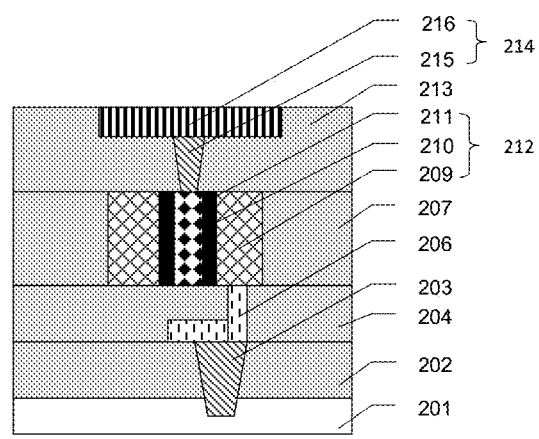
FIG. 13 is a schematic diagram of a phase change memory unit structure according to a preferred embodiment 2 of the present invention.

In another following specific embodiment of the present invention, please refer to FIG. 13, which is a schematic diagram of a phase change memory unit structure according to a preferred embodiment 2 of the present invention. As shown in FIG. 13, a phase change memory unit of the present invention can also be set on a substrate 201. The substrate 201 can also be set with one to multiple dielectric layers, such as the first to fourth dielectric layers 202, 204, 207, and 213; the phase change memory unit can also be embedded in the above-mentioned dielectric layers.

A phase change unit 212 comprises from inside to outside: a cubic cylindrical selector layer 211, a rectangular circular barrier layer 210 and a rectangular circular phase change material layer 209.

The heating electrode 206 adopts an L-shaped structure set on the upper surface of the bottom electrode 203. Wherein, the horizontal bottom sides of the L-shaped structure of the heating electrode 206 is connected to the surface of the bottom electrode 203, and the upper end of the vertical sidewall of the L-shaped structure is correspondingly connected to the lower end of one side of the rectangular ring shape of the circular phase change material layer 209.

The top electrode 214 can comprise an upper metal layer 216 and a lower contact hole 215 which are connected, and the contact hole 215 is connected to the selector layer 211.

Wherein, the lower end of the heating electrode 206 is only connected to the bottom electrode 203, the upper end of the heating electrode 206 is only connected to the circular phase change material layer 209 positioned at the outermost part of the cylindrical phase change unit 212, and the top electrode 214 is only connected to the selector layer 211 positioned at the innermost part of the cylindrical phase change unit 212.

As another alternative, the heating electrode can also adopt a conductive via structure set on the bottom electrode. A via structure is filled with a material of the heating electrode, thus the upper and lower ends of the via structure are respectively connected to the circular lower end of the circular phase change material layer and the upper surface of the bottom electrode.

Other aspects of this embodiment can be the same as the embodiment 1, which can be referred to the above description of the embodiment 1.

A method for preparing the phase change memory unit such as that shown in FIG. 13 according to the present invention will be further described through specific embodiments and accompanying drawings thereof.

Figure 14:
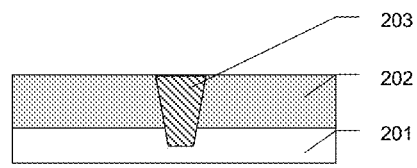
FIG. 14-20 are schematic diagrams of process steps for preparing a phase change memory unit structure of FIG. 13.

Please refer to FIG. 14-20, FIG. 14-20 are schematic diagrams of process steps for preparing a phase change memory unit structure of FIG. 13. As shown in FIG. 14-20, the preparation method for the phase change memory unit comprises following steps:

S01: as shown in FIG. 14, depositing the first dielectric layer 202 on the substrate 201, and forming the bottom electrode 203 in the substrate 201 and the first dielectric layer 202, and the lower half part of the bottom electrode 203 can be positioned in the substrate 201.

Figure 15:
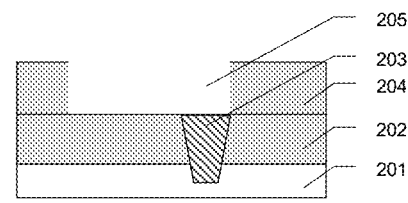

S02: as shown in FIG. 15, depositing the second dielectric layer 204 on the first dielectric layer 202 and the bottom electrode 203, forming the first trench 205 in the second dielectric layer 204.

From a plan view, the shape of the first trench 205 can be one of circle, ellipse, rectangle and polygon. In this embodiment, a rectangular first trench 205 is formed in the second dielectric layer 204. One side of the sidewall of the first trench 205 is aligned with the bottom electrode 203.

Figure 16:
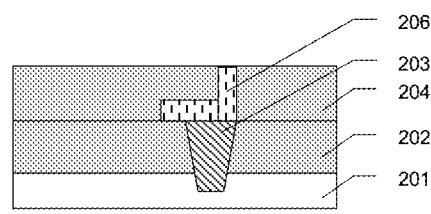

S03: as shown in FIG. 16, forming an L-shaped heating electrode 206 in the second dielectric layer 204, and connecting the horizontal bottom sides of the L-shaped heating electrode 206 with the bottom electrode 203. In this embodiment, a material of a heating electrode thin film is deposited on the inner wall surface of the first rectangular trench 205, and patterning the heating electrode thin film by lithography and etching to remove excess material of the heating electrode on the sidewall and bottom surfaces of the first trench 205, filling a material of a second dielectric layer in the first trench 205 and then flattening by polishing to form the heating electrode 206 which is the L-shaped structure. The material of the heating electrode can be TiN, and the thickness of the vertical sidewall of the L-shaped heating electrode 206 can be 5 nm.

Figure 17:
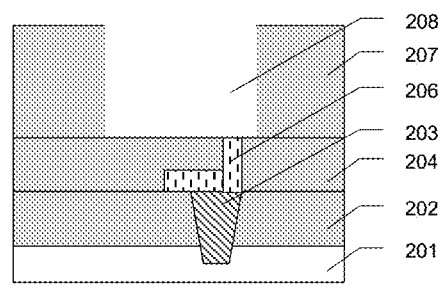

S04: as shown in FIG. 17, forming the third dielectric layer 207 on the second dielectric layer 204 and the heating electrode 206, and forming a second trench 208 in the third dielectric layer 207. The second trench 208 can be one of elliptical cylinder, cylinder, rectangular parallelepiped and prism. In this embodiment, the second trench 208 is a rectangular trench.

Figure 18:
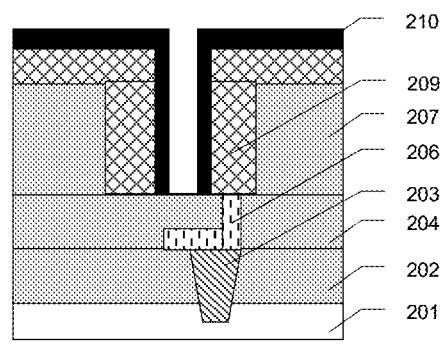

S05: as shown in FIG. 18, sequentially forming the rectangular circular phase change material layer 209 and the circular barrier layer 210 in the second trench 208.

In this embodiment, the material of the circular phase change material layer 209 is $Sc_{0.2}Sb_2Te_3$, and thickness thereof is 10 nm. The material of the circular barrier layer 210 is WCN, and thickness thereof is 10 nm.

HDP CVD is used for depositing the materials of the rectangular circular phase change material layer 209 and the rectangular circular barrier layer 210 in the same equipment. HDP CVD is the deposition-etch-deposition-etch method, so it can ensure that the circular barrier layer 210 and the circular phase change material layer 209 are only deposited on the sidewall of the second trench 208, and no film is deposited on the bottom of the second trench 208, thus the circular phase change material layer 209 and the circular barrier layer 210 are a three-dimensional rectangular ring shape. Wherein, the deposition temperature of the material of the circular phase change material layer is 300° C., and a $Sc_{0.2}Sb_2Te_3$ film is crystalline after deposition. As a barrier layer, a WCN film has stable chemical properties, which is beneficial to improve the performances of the phase change memory device and can effectively prevent mutual diffusion between the materials of the circular phase change material layer and the selector layer 211.

Figure 19:
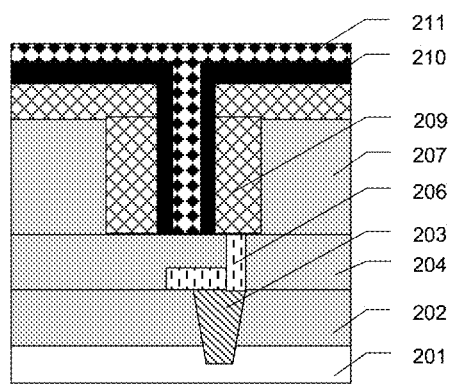

S06: as shown in FIG. 19, depositing the material of the selector layer 211 in the second trench 208, and filling the second trench 208 to form the selector layer 211.

In this embodiment, an atomic layer deposition process is used for depositing the material of the selector layer. The material of the device layer 211 is $Se_{0.44}As_{0.29}Ge_{0.1}Si_{0.17}$. Phase of a $Se_{0.44}As_{0.29}Ge_{0.1}Si_{0.17}$ thin film is amorphous. as a gate device, the phase state of the $Se_{0.44}As_{0.29}Ge_{0.1}Si_{0.17}$ thin film will not change during operations of the phase change unit 212.

Figure 20:
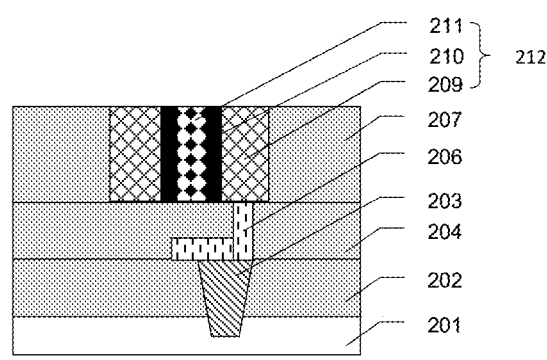
Figure 21:
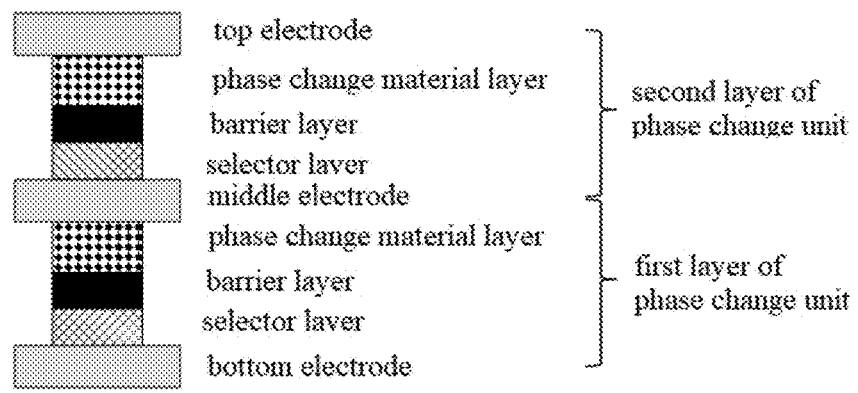
FIG. 21 is a schematic diagram of a traditional 3DX-point phase change memory unit structure.

S07: as shown in FIG. 20, chemical mechanical polishing can be used for removing excess materials outside the second trench 208 to form a rectangular parallelepiped phase change unit 212. The formed rectangular parallelepiped phase change unit 212 comprises the selector layer 211, the circular barrier layer 210, and the circular phase change material layer 209 from inside to outside. In this embodiment, the shape of the phase change unit 212 is cubic column, and it comprises a selector material $Se_{0.44}As_{0.29}Ge_{0.1}Si_{0.17}$, a barrier material WCN, and a phase change material $Sc_{0.2}Sb_2Te_3$ from inside to outside.

S08: forming the fourth dielectric layer 213 on the third dielectric layer 207 and the phase change unit 212, and forming the top electrode 214 in the fourth dielectric layer 213, then forming the phase change memory unit structure which comprising the L-shaped heating electrode 206 and the cubic column phase change unit 212.

Wherein, the top electrode 214 is only connected to the selector layer 211 positioned at the innermost part of the rectangular parallelepiped phase change unit 212. In this embodiment, the top electrode 214 is a structure which comprising the contact hole 215 with the metal layer 216, and the material of the metal layer 216 is copper. the material of the contact hole 215 is tungsten, The contact hole 215 is only connected to a $Sc_{0.2}Sb_2Te_3$ selector layer 211 in the cubic column phase change unit 212.

The preparation method for the phase change memory unit in this embodiment is to prepare a rectangular parallelepiped phase change unit 212 which a three-dimensional rectangular circular nested structure by rectangular trench filling and chemical mechanical polishing. The phase change unit is composed of a selector and a phase change resistor composition. The heating electrode 206 is a three-dimensional "L"-shaped sidewall structure, and thickness thereof is only a few nanometers. Current density generated by the heating electrode 206 is higher, heating efficiency therefor is further improved, and power consumption of a device can be effectively reduced. The phase of the material of the circular phase change material layer is crystalline after deposition, during the operations of the phase change device, a phase change area is only part of the circular phase change material layer above the heating electrode 206 (refer to FIG. 12), and the film thickness of the circular phase change material layer is only 20 nm, thus the volume of the phase change operation area and the heat energy required are greatly reduced, thereby reducing the power consumption of the device. In addition, filling and polishing are used for preparing the phase change unit 212, which will not cause damage to the critical area for the operations of the circular phase change material layer, that is, a contact area between the circular phase change material layer and the heating electrode 206, thus the reliability of the device can be improved.

As another alternative, a via structure penetrating the second dielectric layer can also be formed in the second dielectric layer corresponding to the position of the bottom electrode, and the material of the heating electrode can be filled in the via to form the solid structure of the heating electrode, the upper and lower ends of the via structure are respectively connected to the circular lower end of the circular phase change material layer and the upper surface of the bottom electrode.

Figure 22:
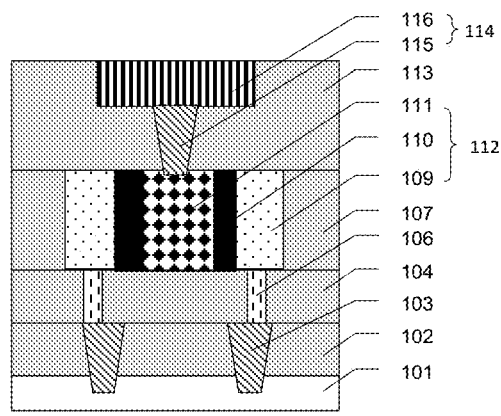
FIG. 22 is a schematic diagram of a phase change memory unit structure according to a preferred embodiment 3 of the present invention.

In following specific embodiments of the present invention, please refer to FIG. 22. FIG. 22 is a schematic diagram of a phase change memory unit structure according to a preferred embodiment 3 of the present invention. As shown in FIG. 22, difference from the embodiment 1 is that in this embodiment, the bottom electrode 103 can adopt a structure of multiple vias. For example, the structure of two vias is shown in FIG. 22, and the two vias can be symmetrically distributed in each of the two sides of the phase change memory unit.

Two heating electrodes 106 are set on the bottom electrode 103 and correspond to the bottom electrode 103 one-to-one; the heating electrodes 106 can be set in the second dielectric layer 104. The heating electrodes 106 can adopt one of a sector structure, a cubic structure, an L-shaped structure or a via structure longitudinally set on the upper surface of the bottom electrode 103. When the L-shaped structure is adopted, the horizontal bottom sides of the L-shaped structure are connected to the surface of the bottom electrode 103, and the upper end of the vertical sidewall of the L-shaped structure is correspondingly connected to the circular lower end of the circular phase change material layer 109.

Figure 25:
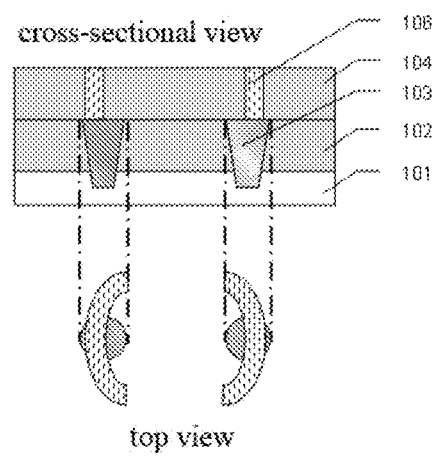

In this embodiment, two heating electrodes 106 in the form of the sector structure are used (please refer to FIG. 25 for understanding). Wherein, the arc surfaces of the two heating electrodes 106 are set opposite to each other; the inner and outer side walls of the fan-shaped bottom surfaces of the heating electrodes 106 are preferably positioned within the upper surface area of the bottom electrode 103. Each of the overall fan-shaped top surfaces of the heating electrodes 106 is correspondingly connected to the lower end surface of the circular phase change material layer 109.

Other aspects of this embodiment can be the same as the embodiment 1, which can be referred to the above description of the embodiment 1.

A method for preparing the phase change memory unit such as that shown in FIG. 22 according to the present invention will be further described through specific embodiments and accompanying drawings thereof.

Figure 23:
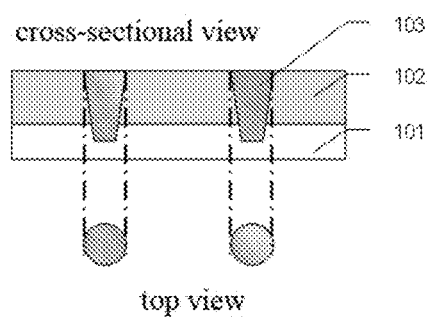
FIG. 23-29 are schematic diagrams of process steps for preparing a phase change memory unit structure of FIG. 22.

Please refer to FIG. 23-29. FIG. 23-29 are schematic diagrams of process steps for preparing a phase change memory unit structure of FIG. 22. As shown in FIG. 23-29, the preparation method for the phase change memory unit comprises following steps:

S11: as shown in FIG. 23, in order to clearly reflect the structure of the present invention, the upper part of FIG. 23 shows a cross-sectional view, and the lower part of FIG. 23 shows a top view (the same below). Depositing the first dielectric layer 102 on the substrate 101, and forming two via bottom electrodes 103 in the first dielectric layer 102. Wherein, the lower half part of the bottom electrode 103 can be positioned in the substrate 101, and the upper half part can be positioned in the first dielectric layer 102. In this embodiment, the bottom electrode 103 can be a tungsten electrode via, and diameter thereof can be 40 nm.

Figure 24:
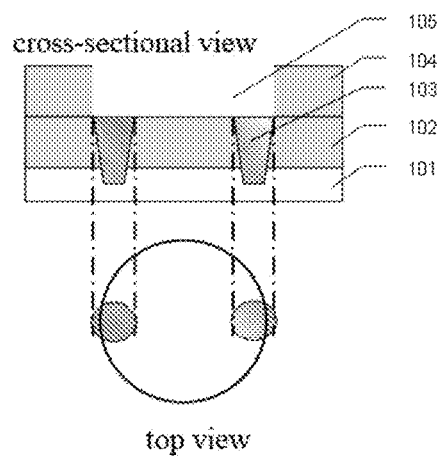

S12: as shown in FIG. 24, depositing the second dielectric layer 104 on the first dielectric layer 102 and the bottom electrode 103, and forming the first trench structure 105 penetrating through the second dielectric layer 104 in the second dielectric layer 104 corresponding to the position of the bottom electrode 103.

From a plan view, the first trench 105 can adopt one of circle, ellipse, rectangle and polygon. In this embodiment, the circular first trench 105 is formed in the second dielectric layer 104. The diameter of the first trench 105 is slightly smaller than the sum of the diameter of the two bottom electrodes 103 and the distance between the two bottom electrodes 103.

S13: as shown in FIG. 25, forming the heating electrodes 106 on the inner wall surface of the first trench 105, and connecting the heating electrodes 106 to the bottom electrode 103.

The heating electrode 106 can be at least one of a fan-shaped structure (three-dimensional fan ring), a via, and a three-dimensional "L"-shaped sidewall structure. A heating electrode film can be deposited by atomic layer deposition, chemical vapor deposition, or high-density plasma chemical vapor deposition (HDP CVD). In this embodiment, the heating electrode film is deposited on the sidewall of the first trench 105 by HDP CVD (high-density plasma chemical vapor deposition). HDP CVD is a deposition-etch-deposition-etch method, so it can ensure that the heating electrode film is only deposited on the sidewall of the first trench 105, and no film is deposited on the bottom of the first trench 105, thus the deposited heating electrode has a three-dimensional circular ring shape. Then through lithography and etching, a circular heating electrode is separated into two sector-shaped heating electrodes, and then depositing the material of the second dielectric layer 104 in the first trench 105 and polishing, two three-dimensional sector heating electrodes 106 are finally formed.

The material of the heating electrodes 106 can be TaN, the thickness of the heating electrode 106 which is a difference between the radius of the outer ring and the radius of the inner ring thereof can be about 10 nm.

Figure 26:
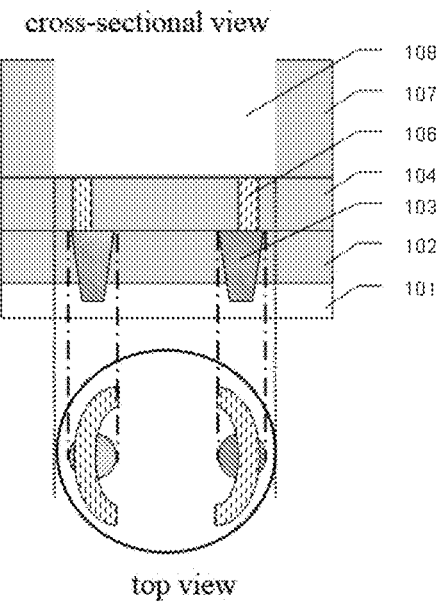

S14: as shown in FIG. 26, depositing the third dielectric layer 107 on the second dielectric layer 104 and the heating electrode 106, and forming the second trench 108 structure penetrating through the third dielectric layer 107 corresponding to a position above the two bottom electrodes 103.

The second trench 108 can be one of an elliptical cylindrical shape, a cylindrical shape, a rectangular parallelepiped and a prism. In this embodiment, the second trench 108 is a cylindrical trench, and diameter thereof is larger than the first trench 105.

Figure 27:
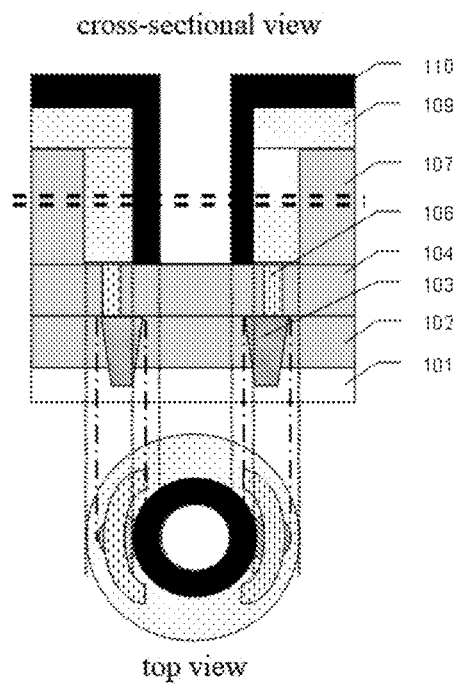

S15: as shown in FIG. 27, the three-dimensional circular phase change material layer 109 and the circular barrier layer 110 are sequentially formed on the sidewall surface of the second trench 108, and the circular phase change material layer 109 is connected to the heating electrode 106.

Figure 28:
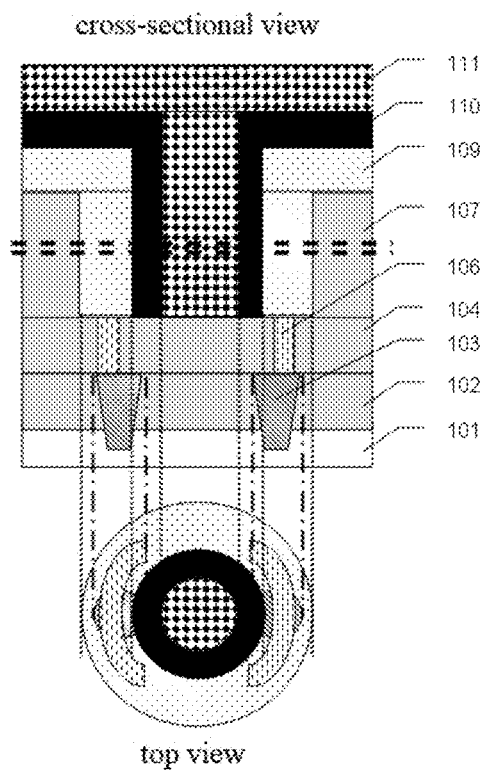

S16: as shown in FIG. 28, depositing the material of the selector layer 111 in the second trench 108 which is in the circular barrier layer 110, and filling the second trench 108 fully.

Figure 29:
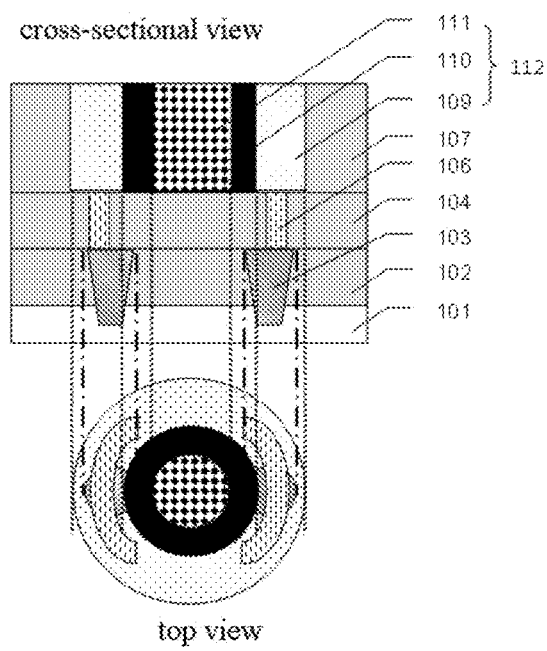

S17: as shown in FIG. 29, removing excess materials of the selector layer 111, the circular barrier layer 110 and the circular phase change material layer 109 outside the second trench 108 by chemical mechanical polishing to form the cylindrical phase change unit 112 in the second trench 108.

The shape of the cylindrical phase change unit can be one of elliptical cylinder, cylinder, rectangular parallelepiped and a prism. The top ends of the two heating electrodes 106 are only connected to the outermost phase change material layer 109 of the same cylindrical phase change unit 112, and the bottom ends of the heating electrodes 106 are connected to different bottom electrodes 103 in one-to-one correspondence. Different bottom electrodes 103 can be connected to different metal interconnection layers in the substrate 101. The phase change unit 112 is connected to the top ends of the two sector-shaped heating electrodes 106 to form a 1S2R structure, that is, two phase change resistors share one selector.

S18: depositing the fourth dielectric layer 113 on the third dielectric layer 107 and the phase change unit 112, and forming the top electrode 114 connected to the selector layer 111 in the fourth dielectric layer 113, thus forming the 1S2R phase change memory unit structure with the fan ring-shaped heating electrodes 106 and the cylindrical phase change unit 112 as shown in FIG. 22.

The top electrode 114 formed is only connected to the innermost selector layer 111 of the cylindrical phase change unit 112. In this embodiment, the top electrode 114 is a structure comprising the contact hole 115 and the metal layer 116, the material of the contact hole 115 is tungsten, and the material of the metal layer 116 is copper. The tungsten contact hole 115 is only connected to the material of the selector layer 111 which is $GeSeAs_2$ in the column phase change unit 112.

The high-density phase change memory unit disclosed in the above embodiment comprises two via bottom electrodes 103, two fan-shaped heating electrodes 106, the cylindrical phase change unit 112, and the top electrode 114 from bottom to top. The phase change unit 112 comprises the selector layer 111, the circular barrier layer 110, and the circular phase change material layer 109 from the inside out, thus forming a structure (1S2R) in which two phase change resistors R1 and R2 share one selector (S). Compared with an existing 1S1R structure, the 1S2R of the present invention eliminates one selector, different phase change resistors can be connected to the bottom electrodes in different metal interconnection layers by respective heating electrodes thereof, so it does not increase an area of a chip in the horizontal direction, thus realizing high-density storage.

Figure 30:
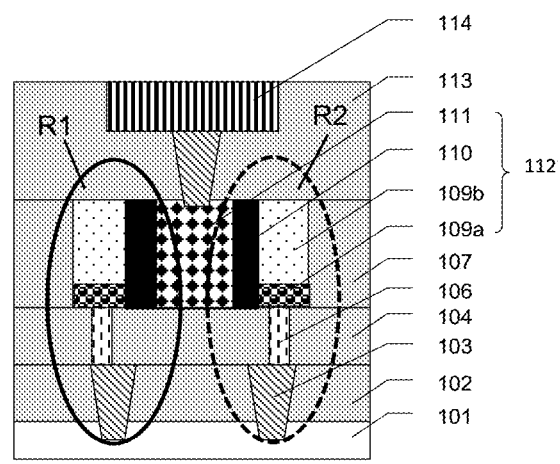
FIG. 30 is a schematic diagram of a phase change operation area of a phase change material layer.

In addition, as shown in FIG. 30, since during the operations of the phase change device, a phase change area is only part of the phase change material above the heating electrode, the phase of the material of the circular phase change material layer 109 is crystalline after deposition, after a write operation, a phase change operation region 109a in the circular phase change material layer 109 changes from crystalline to amorphous, and other regions 109b in the circular phase change material layer 109 are still crystalline.

Since the thickness of the phase change material film is only 25 nm, the volume of the phase change operation area 109a and the heat energy required therefor are greatly reduced, thus reducing the power consumption of the device.

Further, the thickness of the heating electrode 106 deposited by the three-dimensional sector-shaped sidewall is only 10 nm, current density generated by the heating electrodes is higher, the heating efficiency thereof is improved, and power consumption of a device is further reduced. Therefore, the phase change memory unit can not only realize high-density storage, but also effectively reduce the power consumption of the device.

Figure 31:
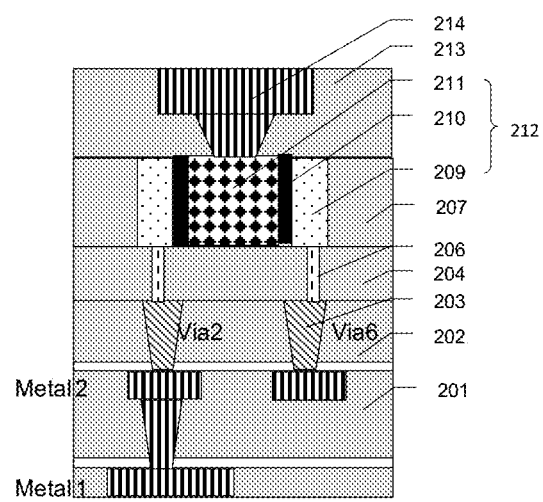
FIG. 31 is a schematic diagram of a phase change memory unit structure according to a preferred embodiment 4 of the present invention.

In following another specific embodiment of the present invention, please refer to FIG. 31, which is a schematic structural diagram of a phase change memory unit according to a preferred embodiment 4 of the present invention. As shown in FIG. 31, a phase change memory unit of the present invention can also be set on a substrate 201. The substrate 201 can also be set with one to multiple dielectric layers, such as the first to fourth dielectric layers 202, 204, 207, and 213; the phase change memory unit can also be embedded in the above-mentioned dielectric layers.

The substrate 201 can comprise a semiconductor material, such as a silicon substrate, a gallium arsenide substrate, a germanium substrate, a silicon germanium substrate, or a fully depleted silicon-on-insulator (FDSOI) substrate. The substrate 101 can also be an integrated circuit, comprising an integrated circuit having a gate tube such as a triode, a diode, etc. In this embodiment, the substrate 201 is a substrate with two metal interconnection layers (Metal1 and Metal2).

The bottom electrode 203 can be set in the substrate 201 and the first dielectric layer 202. For example, the lower part of the bottom electrode 203 is set in the substrate 201, and the upper part exposes the surface of the substrate 201 and is set in the first dielectric layer 202. The bottom electrode 203 can adopt a structure of multiple vias, for example, a structure of six vias (please refer to the vias Via1 to Via6 in the top view of FIG. 32); the six vias can form a symmetrically distributed hexagon and are set below the phase change memory unit. The material of the bottom electrode 203 can be TiN, which is not limited thereto.

Figure 32:
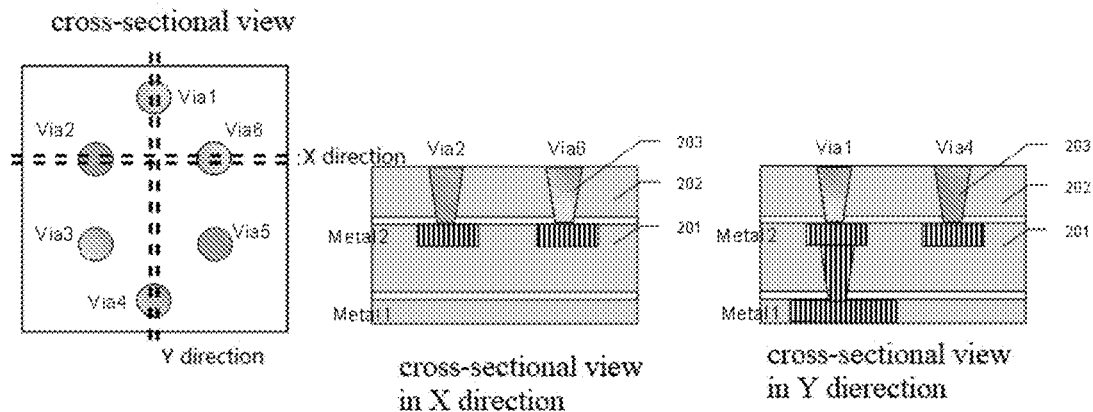
FIG. 32-39 are schematic diagrams of process steps for preparing a phase change memory unit structure of FIG. 31.

Wherein, the vias Via1, Via3, and Via5 of the six bottom electrodes 203 can be connected to the first metal interconnection layer (Metal1) through the second metal interconnection layer (Metal2), while the vias Via2, Via4 and Via6 are only connected to the second metal interconnection layer. FIG. 32 respectively lists cross-sectional views in X direction and Y direction from the top view, which can illustrate a relationship between the bottom electrodes Via1 to Via6 more clearly.

The phase change unit 212 comprises from inside to outside: the cubic cylindrical selector layer 211, the rectangular circular barrier layer 210 and the rectangular circular phase change material layer 209.

The heating electrode 206 adopts a cubic structure comprising six vertical strips separately set on the upper surface of the corresponding bottom electrode 203. The bottom sides of the strip structure of the heating electrodes 206 are connected to the surface of the bottom electrode 203, and the upper sides of the six strip structures are correspondingly connected to the lower ends of the rectangular ring shape four sides of the circular phase change material layer 209, and are corresponds to each of the side directions of the circular phase change material layer 209 (please refer to the top view of FIG. 39).

The top electrode 214 can comprise an upper metal layer and a lower contact hole which are connected, and the contact hole is connected to the selector layer 211.

Wherein, the lower end of each of the heating electrodes 206 is only connected to a corresponding bottom electrode 203, and the upper end of each of the heating electrodes 206 is only connected to a corresponding side of the circular phase change material layer 209 positioned at the outermost part of the cylindrical phase change unit 212, The top electrode 214 is only connected to the selector layer 211 positioned at the innermost side of the cylindrical phase change unit 212.

As another alternative, the heating electrodes can also adopt a structure of six conductive vias set on the bottom electrode, the via structures are filled with material of the heating electrode, thus the upper and lower ends of the via structures are respectively connected to the circular lower end of the circular phase change material layer and the upper surface of the bottom electrode. Alternatively, the heating electrodes can also adopt an L-shaped structure separately set on the bottom electrode; wherein the horizontal bottom sides of the L-shaped structure are connected to the surface of the bottom electrode, and each of the upper end of the vertical sidewall of the L-shaped structure is correspondingly connected to the corresponding side of the circular lower end of the material layer.

Other aspects of this embodiment can be the same as the embodiment 1, which can be referred to the above description of the embodiment 1.

A method for preparing a phase change memory unit such as that shown in FIG. 31 according to the present invention will be further described through specific embodiments and accompanying drawings thereof.

Please refer to FIG. 32-39. FIG. 32-39 are schematic diagrams of process steps for preparing the phase change memory unit structure of FIG. 31. As shown in FIG. 32-39, the method for preparing a phase change memory unit of the present invention can comprise following steps:

S11: as shown in FIG. 32, which shows a top view and a cross-sectional view in X direction and Y direction from the top view (the same below), the first dielectric layer 202 is deposited on the substrate 201, and the bottom electrodes 203 are formed in the first dielectric layer 202 and the substrate 201.

In this embodiment, the substrate 201 has two metal interconnection layers (Metal2 and Metal1). A first dielectric layer 202 is deposited on the substrate 201, the bottom electrodes 203 are formed in the first dielectric layer 202, and the lower half part of the bottom electrodes 203 are set in the substrate 201 and the lower half part of the bottom electrode 203 is set in the substrate 201 and is connected with the second layer (Metal2) of the metal interconnection layers in the substrate 201.

From the top view, the bottom electrodes 203 are six vias (Via1 to Via6), and the material of the bottom electrodes 203 is TiN. Wherein, the vias Via1, Via3, and Via5 are connected to the first layer (Metal1) of the metal interconnection layers by the second layer (Metal2) of the metal interconnection layers, while the vias Via2, Via4 and Via6 are only connected to the second layer (Metal2) of the metal interconnection layers. From cross-sectional views in the X direction and the Y direction, a relationship between the bottom electrodes Via1 to Via6 can be more clearly illustrated.

Figure 33:
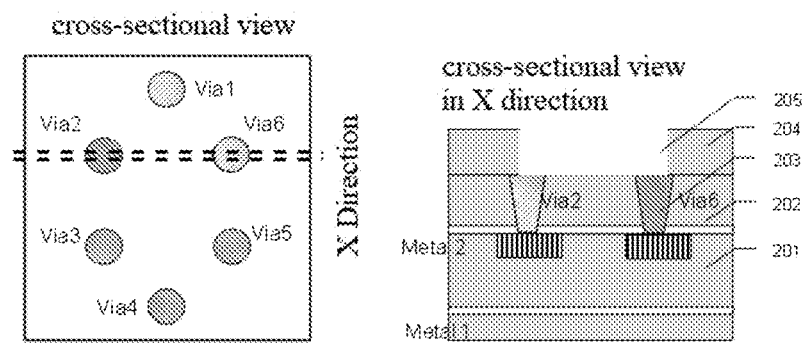

S12: as shown in FIG. 33, the second dielectric layer 204 is deposited on the first dielectric layer 202 and the bottom electrode 203, and a first trench 205 is formed in the second dielectric layer 204.

From a plan view, the first trench 205 can be one of circle, ellipse, rectangle, and polygon. In this embodiment, a rectangular first trench 205 is formed in the second dielectric layer 204.

The length of the rectangular first trench 205 in all directions is less than the sum of the distance between the two bottom electrodes 203 and the diameter of the two bottom electrodes 203. That is, the length of the first trench 205 in the X direction, for example, is smaller than the sum of the diameter of the via Via2, the diameter of the via Via6, and the distance between the via Via2 and the via Via6.

Figure 34:
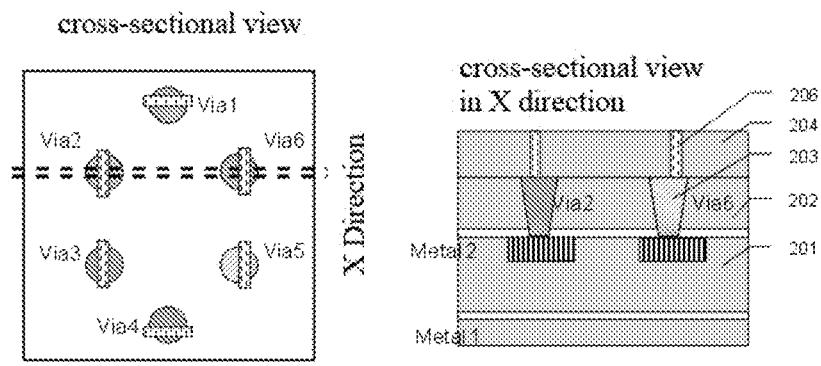

S13: as shown in FIG. 34, six strip-shaped (cuboid-shaped) heating electrodes 206 are formed in the second dielectric layer 204, thus the lower end of each of the heating electrodes 206 is connected to a corresponding bottom electrode 203. The thin film of the heating electrodes 206 can be deposited by atomic layer deposition, chemical vapor deposition or HDP CVD. In this embodiment, the thin film of the heating electrodes 206 is deposited on the sidewall of the rectangular first trench 205 by high-density plasma chemical vapor deposition (HDP CVD).

HDP CVD is a deposition-etch-deposition-etch method, so it can ensure that thin film of the heating electrodes 206 is only deposited on the sidewall of the first trench 205, and no film is deposited on the bottom of the first trench 205, thus the deposited heating electrodes have a three-dimensional rectangular ring shape. Then through lithography and etching, a circular heating electrode is separated into six rectangular heating electrodes, and then depositing the material of the second dielectric layer 204 and polishing, finally six three-dimensional rectangular heating electrodes 206 are formed. The material of the heating electrodes can be TiN, the thickness of TiN which is a difference between outside and inside thereof is 5 nm.

Figure 35:
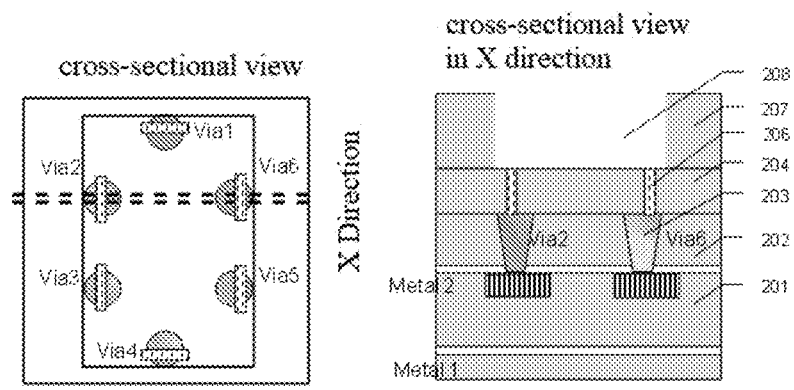

S14: as shown in FIG. 35, a third dielectric layer 207 is deposited on the second dielectric layer 204 and the heating electrode 206, and a second trench 208 is formed in the third dielectric layer 207. The second trench 208 can be one of elliptical cylinder, cylinder, rectangular parallelepiped and prism. In this embodiment, the second trench 208 is a rectangular trench, and its length in all directions is greater than that of the rectangular first trench 205.

Figure 36:
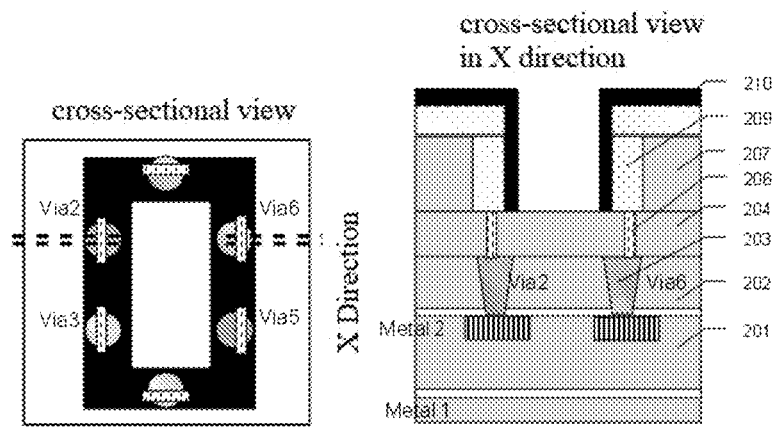

S15: as shown in FIG. 36, the rectangular circular phase change material layer 209 and the circular barrier layer 210 are sequentially formed in the second trench 208.

In this embodiment, the material of the circular phase change material layer 209 is $Sc_{0.2}Sb_2Te_3$, and thickness thereof is 15 nm. The material of the circular barrier layer 210 is WCN, and thickness thereof is 10 nm.

Figure 37:
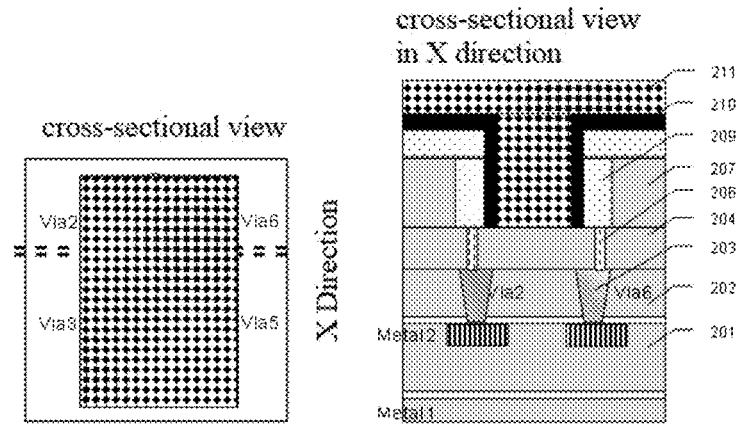

S16: as shown in FIG. 37, the material of the selector layer 211 is deposited in the second trench 208, and the second trench 208 is filled to form the selector layer 211.

Figure 38:
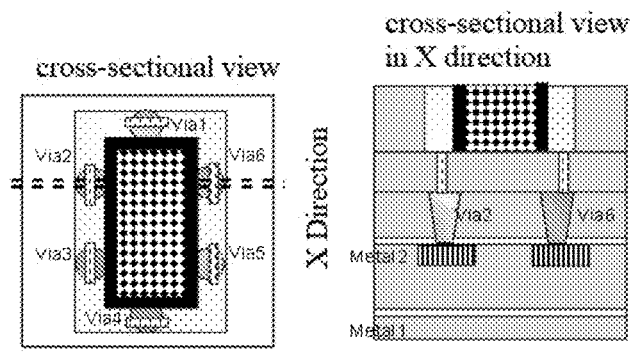

S17: as shown in FIG. 38, excess materials outside the second trench 208 is removed by chemical mechanical polishing to form the rectangular parallelepiped phase change unit 212.

Figure 39:
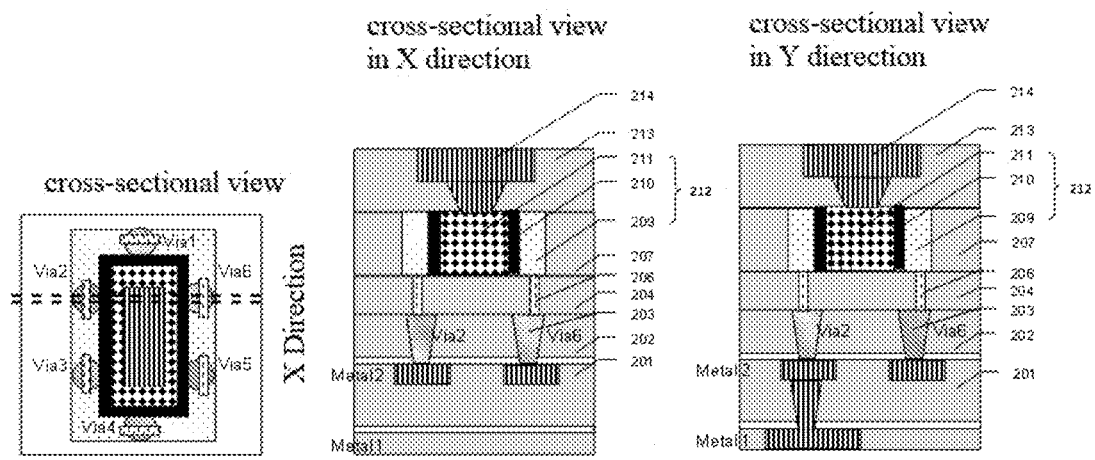

S18: as shown in FIG. 39, the fourth dielectric layer 213 is deposited on the third dielectric layer 207 and the phase change unit 212, and the top electrode 214 is formed in the fourth dielectric layer 213. The top electrode 214 is only connected to the innermost selector layer 211 of the rectangular parallelepiped phase change unit 212. Different bottom electrodes 203 can be connected to different metal interconnection layers.

In this embodiment, the top electrode 214 is a trench with a double damascene structure, and the material of the top electrode 214 is copper. The contact hole in the double damascene structure is only connected to the material of the selector layer 111 which is $Se_{0.44}As_{0.29}Ge_{0.1}Si_{0.17}$ in the column phase change unit 112. Finally, a 1S6R phase change memory unit structure with six strip heating electrodes 206 and cubic column phase change units 212 as shown in FIG. 31 is formed.

The high-density phase change memory unit disclosed in the above embodiment comprises six bottom electrodes 203 which are vias from bottom to top, corresponding six bar-shaped heater electrodes 206, corresponding cylindrical phase change units 212, and corresponding top electrodes 214. Wherein, the phase change unit 212 is a rectangular parallelepiped, and comprises a selector layer 211, a barrier layer 210, and a phase change material layer 209 from inside to the outside. The top ends of the six heating electrodes 206 are connected to a corresponding side of the circular phase change material layer 209 positioned at the outermost part of the cylindrical phase change unit 212, and the bottom ends of the six heating electrodes 206 are connected to different bottom electrodes 203 and correspond to each other to form six phase changes, thus six resistors (R) share one selector (S) of a structure (1S6R). Compared with an existing 1S1R structure, the structure (1S6R) saves 5 selectors. The vias Via1, Via3 and Via5 in the bottom electrode 203 are connected to the first layer (Metal1) of the metal interconnection layers penetrating through the second layer (Metal2) of the metal interconnection layers. The vias Via2, Via4, and Via6 are only connected to the second metal interconnection layer (Metal2). A metal layer is added, but it does not increase an area of a chip in the horizontal direction, so as to realize the high-density storage.

As another optional method, a via structure penetrating the second dielectric layer can also be formed in the second dielectric layer corresponding to the position of the bottom electrode, and a material of heating electrodes can be filled in the via to form a solid structure heating electrode. The upper and lower ends of the heating electrodes which are the via structures are respectively connected to the circular lower end of the circular phase change material layer and the upper surface of the bottom electrode. Alternatively, the heating electrodes with an L-shaped structure can also be formed in the second dielectric layer corresponding to the position of the bottom electrode, which can comprise: depositing the material of the heating electrode on the inner wall surface of the first trench, patterning the Material of the heating electrode, and removing excess the material of the heating electrode on the sidewall and bottom surface of the first trench, then depositing the material of the second dielectric layer in the first trench to fill the first trench and then flattening it to form the heating electrode.

The above descriptions are only the preferred embodiments of the present invention, and the described embodiments are not used to limit the scope of patent protection of the present invention. Therefore, any equivalent structural changes made using the contents of the description and drawings of the present invention should be included in the same reasoning within the protection scope of the appended claims of the present invention.

What is claimed is:

1. A phase change memory unit, wherein comprising from bottom to top: a bottom electrode, a heating electrode, a phase change unit and a top electrode, the phase change unit is a longitudinally arranged column, which comprise a cylindrical selector layer, a circular barrier layer and a circular phase change material layer form inside to outside; wherein, the bottom electrode, the heating electrode and the circular phase change material layer are sequentially connected, and the selector layer is connected to the top electrode.

2. The phase change memory unit of claim 1, wherein the number of the bottom electrode is one.

3. The phase change memory unit of claim 2, wherein the heating electrode is a circular or via structure longitudinally set on the bottom electrode, and is correspondingly connected to the circular lower end of the circular phase change material layer.

4. The phase change memory unit of claim 2, wherein the heater electrode is an L-shaped structure set on the bottom electrode, and the horizontal bottom sides of the L-shaped structure are connected to the surface of the bottom electrode, the upper end of the vertical sidewall of the L-shaped structure is correspondingly connected to the circular lower end of the circular phase change material layer.

5. The phase change memory unit of claim 2, wherein the bottom electrode is connected to a substrate, a dielectric layer is set on the substrate, and the phase change memory unit is embedded in the dielectric layer.

6. The phase change memory unit of claim 5, wherein the top electrode comprises a metal layer and a contact hole connected to the metal layer, and the contact hole is connected to the selector layer.

7. The phase change memory unit of claim 1, wherein multiple bottom electrodes and multiple heating electrodes are in one-to-one correspondence.

8. The phase change memory unit of claim 7, wherein the bottom electrodes are a via.

9. The phase change memory unit of claim 7, wherein the heating electrodes are a sector structure, a cubic structure or a via longitudinally set on the bottom electrode, and are correspondingly connected to the circular lower end of the circular phase change material layer; or, the heating electrodes are an L-shaped structure set on the bottom electrodes, and the horizontal bottom sides of the L-shaped structure are connected to the surface of the bottom electrodes, the upper end of the vertical sidewall of the L-shaped structure is correspondingly connected to the circular lower end of the circular phase change material layer.

10. The phase change memory unit of claim 7, wherein the bottom electrodes are connected to a substrate, the substrate is set with one to multiple dielectric layers, and the phase change memory unit is embedded in the dielectric layer.

11. The phase change memory unit of claim 10, wherein the substrate comprises multiple metal interconnection layers, and at least one of the bottom electrodes is connected to one of the multiple metal interconnection layers different from other bottom electrodes.

12. A preparation method for a phase change memory unit, wherein comprising:
S01: providing a substrate, depositing a first dielectric layer on the substrate, and forming a bottom electrode in the substrate and the first dielectric layer; wherein the number of the bottom electrode is one;
S02: depositing a second dielectric layer on the first dielectric layer, and forming a first trench or a via in and through the second dielectric layer corresponding to the position of the bottom electrode;
S03: forming a heating electrode on the inner wall surface of the first trench or in the via, and connecting the heating electrode with the bottom electrode;
S04: depositing a third dielectric layer on the second dielectric layer, and forming a second trench in and through the third dielectric layer corresponding to the position of the bottom electrode;
S05: sequentially forming a circular phase change material layer and a circular barrier layer on the sidewall surface of the second trench, and connecting the circular phase change material layer with the heating electrode;
S06: depositing a material of a selector layer in the second trench in the circular barrier layer to fill the second trench;

S07: removing excess materials of the selector layer, the circular barrier layer and the circular phase change material layer outside the second trench, and forming a cylindrical phase change unit in the second trench;

S08: depositing a fourth dielectric layer on the third dielectric layer, and forming a top electrode connected to the selector layer in the fourth dielectric layer.

13. The method of claim 12, wherein in S03, the heating electrode which is a circular or L-shaped structure is formed on the inner wall surface of the first trench; or, filling the material of the heating electrode in the via to form the heating electrode which is a solid structure.

14. The preparation method of claim 12, wherein in S05, using a high-density plasma chemical vapor deposition method to sequentially form the circular phase change material layer and the circular barrier layer on the sidewall surface of the second trench.

15. The preparation method of claim 13, wherein a preparation method for the heating electrode which is the circular structure comprises: depositing the material of the heating electrode on the inner wall surface of the first trench, removing the material of the heating electrode positioned on the bottom surface of the first trench, depositing the material of the second dielectric layer in the first trench to fill the first trench and then flattening.

16. The preparation method of claim 13, wherein a preparation method for the heating electrode which is the L-shaped structure comprises: depositing the material of the heating electrode on the inner wall surface of the first trench, patterning the material of the heating electrode, removing excess material of the heating electrode positioned on the sidewall and bottom surface of the first trench, depositing the material of the second dielectric layer in the first trench to fill the first trench and then flattening.

17. A preparation method for a phase change memory unit, wherein comprising:

S11: providing a substrate, depositing a first dielectric layer on the substrate, and forming multiple bottom electrodes in the substrate and the first dielectric layer;

S12: depositing a second dielectric layer on the first dielectric layer, and forming a first trench or a via in and through the second dielectric layer corresponding to the positions of the bottom electrodes; wherein, the number of the first trench is one, multiple vias and the bottom electrodes are in one-to-one correspondence;

S13: forming heating electrodes on the inner wall surface of the first trench or in the vias, and connecting the heating electrodes with the bottom electrodes in one-to-one correspondence;

S14: depositing a third dielectric layer on the second dielectric layer, and forming a second trench in and through the third dielectric layer corresponding to the positions of the bottom electrodes; wherein, the number of the second trench is one;

S15: sequentially forming a circular phase change material layer and a barrier layer on the sidewall surface of the second trench, and connecting the circular phase change material layer with the heating electrodes;

S16: depositing a material of a selector layer in the second trench in the circular barrier layer to fill the second trench;

S17: removing excess materials of the selector layer, the circular barrier layer and the circular phase change material layer outside the second trench, and forming a cylindrical phase change unit in the second trench;

S18: depositing a fourth dielectric layer on the third dielectric layer, and forming a top electrode connected to the selector layer in the fourth dielectric layer.

18. The preparation method of claim 17, wherein in S13, depositing the material of the heating electrodes on the inner wall surface of the first trench, and then patterning to form the heating electrodes which are sector structures, cubic structures or L-shaped structures; wherein, the horizontal bottom sides of the L-shaped structure are connected to the surfaces of the bottom electrodes, and the upper end of the vertical sidewall of the L-shaped structure is correspondingly connected to the circular lower end of the circular phase change material layer; or, by filling the material of the heating electrodes in the via to form the heating electrodes which is a solid structure.

19. The preparation method of claim 18, wherein, a preparation method for the heating electrodes which are the sector structure or cubic structure comprises: depositing the material of the heating electrode on the inner wall surface of the first trench, removing the material of the heating electrodes positioned on the bottom surface of the first trench, depositing the material of the second dielectric layer in the first trench to fill the first trench and then flattening.

20. The preparation method of claim 18, wherein, a preparation method for the heating electrodes which are the L-shaped structure comprises: depositing the material of the heating electrodes on the inner wall surface of the first trench, patterning the material of the heating electrodes and removing excess material of the heating electrodes positioned on the sidewall surface and bottom surface of the first trench, depositing the material of the second dielectric layer in the first trench to fill the first trench and then flattening.

* * * * *